United States Patent

Hiramoto et al.

[11] Patent Number: 6,110,609
[45] Date of Patent: Aug. 29, 2000

[54] MAGNETIC THIN FILM AND MAGNETIC HEAD USING THE SAME

[75] Inventors: Masayoshi Hiramoto, Ikoma; Nozomu Matsukawa, Yamatokoriyama; Hiroshi Sakakima, Kyotanabe, all of Japan

[73] Assignee: Matsushita Electric Industrial Co., Ltd., Osaka, Japan

[21] Appl. No.: 09/144,733

[22] Filed: Sep. 1, 1998

[30] Foreign Application Priority Data

Sep. 2, 1997 [JP] Japan ................................. 9-236779

[51] Int. Cl.$^7$ ....................................................... G11B 5/66
[52] U.S. Cl. ............... 428/692; 428/694 T; 428/694 TS; 428/694 R; 428/900; 360/113; 360/128; 324/252
[58] Field of Search ............................. 428/694 T, 694 TS, 428/694 R, 900; 324/252, 692; 360/113, 128

[56] References Cited

U.S. PATENT DOCUMENTS

| | | | |
|---|---|---|---|
| 4,400,444 | 8/1983 | Izumi et al. | 428/694 T |
| 5,837,392 | 11/1998 | Katori | 428/692 |
| 5,843,569 | 12/1998 | Kaitsu | 428/323 |
| 5,846,648 | 12/1998 | Chen | 428/332 |
| 5,908,711 | 6/1999 | Tachibana | 428/694 T |
| 5,962,153 | 10/1999 | Kirino | 428/692 |
| 5,976,713 | 11/1999 | Fuke | 428/692 |
| 5,981,054 | 11/1999 | Hikosaka | 428/328 |

FOREIGN PATENT DOCUMENTS

| | | |
|---|---|---|
| 5-114530 | 5/1993 | Japan . |
| 8-130114 | 5/1996 | Japan . |

OTHER PUBLICATIONS

Peng et al "Structure and magnetic propeties . . . " J. of M. and M. Materials, 172, pp. 41–52, Jan. 1997.

M. Senda et al. "GHz range complex permeability measurement of magnetic film using transmission line" *NTT Interdisciplinary Research Labs* (MAG–94–95), pp. 77–83. (w/partial English translation) 1994.

D.L. Peng et al. "Structure and magnetic properties of Fe–Cr–N sputter–deposited films" *Journal of Magnetism and Magnetic Materials*, vol. 172, pp. 41–52 Aug. 1997.

Communication from European Patent Office and attached Search Report Dec. 1998.

*Primary Examiner*—Leszek Kiliman
*Attorney, Agent, or Firm*—Merchant & Gould P.C.

[57] ABSTRACT

A magnetic thin film includes magnetic crystal grains and a region where an average crystal size of the magnetic crystal grains along a first direction is smaller than an average crystal size of the magnetic crystal grains along a second direction that is orthogonal to the first direction. Magnetization along the first direction is effected by an external magnetic field that is smaller than an external magnetic field for magnetization along the second direction. Thus, excellent characteristics in a high frequency can be obtained.

21 Claims, 3 Drawing Sheets

MAGNETIC THIN FILM AND MAGNETIC HEAD USING THE SAME

BACKGROUND OF THE INVENTION

1. Field of the Invention

The present invention relates to a magnetic thin film. More specifically, the present invention relates to a soft magnetic thin film suitable for a magnetic sensor such as a magnetic impedance sensor, a magnetic circuit component such as a magnetic coil and an inductor, a magnetic recording head, and a magnetic reproducing head. The present invention also relates to a magnetic head using such a magnetic thin film.

2. Description of the Prior Art

Recently, a magnetic material having both excellent magnetic characteristics and a high saturation magnetic flux density in a high frequency band of several MHz to several GHz has been demanded in the field of a magnetic device using a soft magnetic material, such as a magnetic recording head, a magnetic impedance sensor, and a magnetic circuit component such as a microinductor. In such a high frequency band, it is known that the magnetic characteristics are deteriorated by a loss due to magnetic domain wall resonance, ferromagnetic resonance or the like. Conventionally, in order to prevent such deterioration, for example, the number of magnetic domain walls in a film plane is reduced in the case of a Co based amorphous material having a low Curie temperature. In order to raise ferromagnetic resonance frequency, a technique of generating a strong uniaxial anisotropy in a material by performing a heat treatment in a magnetic filed or forming a film in a magnetic field has been used (Senda et al. MAG-94-95, pp77–83). For Fe or FeCo based crystalline material having a high Curie temperature, a technique of generating a uniaxial anisotropic magnetic field by using an inverse magnetostriction effect in a film plane has been used, in addition to the above-mentioned technique.

It is known that the relative permeability $\mu_r'$ and the ferromagnetic resonance $f_k$ of a magnetic substance satisfy the following equations:

$$\mu_r'(0) = 4\pi Ms \cdot H_k \quad (1)$$

$$f_k = (\gamma/2\pi)(4\pi Ms \cdot H_k)^{1/2} \quad (2)$$

where $4\pi Ms$ represents a saturation magnetization, $H_k$ represents a uniaxial anisotropic magnetic field, and $\gamma$ represents a gyro-magnetic constant.

As seen from Equation (2), for a high frequency band magnetic device, a high saturation magnetization or a high uniaxial anisotropic magnetic field is required. Generally, a Co based amorphous material has a low saturation magnetization of about 10 kG, so that a high uniaxial anisotropic magnetic field is required. However, as seen from Equation (1), a high uniaxial anisotropic magnetic field leads to a low relative permeability. Furthermore, such an amorphous material cannot provide sufficient magnetization for magnetic recording in a medium having a high coercive force.

On the other hand, Fe or FeCo based crystalline material having a high saturation magnetization has a high Curie temperature, so that a heat treatment in a magnetic field or formation of a film in a magnetic field cannot provide a sufficient uniaxial anisotropic magnetic field. Furthermore, it is difficult to control the magnitude of anisotropy.

Especially, in a magnetron sputtering method often used for forming a magnetic thin film, the magnetostatic leakage field from a target is not uniform, so that it is difficult to provide a suitable uniaxial anisotropy. Furthermore, the uniaxial anisotropy that can be provided by an inverse magnetostriction effect in proportion to a product of an internal stress and a saturation magnetostriction is restricted by a stress distribution depending on the shape of the film. Furthermore, a high saturation magnetostriction degrades the magnetic characteristics.

With the development of the miniaturization of a magnetic device in recent years, a magnetic material tends to be processed into more miniaturized patterns. For example, for a magnetic head such as an MIG head (Metal In Gap head) and a head for a hard disk, a magnetic thin film is processed into a rectangular parallelopiped with dimensions in the range of about several hundreds of nanometers to several micrometers. In such a shape, the shape anisotropy is relatively low, so that the magnetization not only rotates in a specific plane but also easily moves in other planes.

Especially, a so-called granular material has a high saturation magnetic flux density, but the film structure is three-dimensionally isotropic. Therefore, since the freedom degree in the direction of the rotation magnetization is large, it is difficult to control the plane for the rotation magnetization. Furthermore, it is difficult to provide the magnetic anisotropy in a micro region uniformly by using an external magnetic field.

SUMMARY OF THE INVENTION

Therefore, with the foregoing in mind, it is the object of the present invention to provide a crystalline magnetic thin film exhibiting excellent characteristics in a high frequency and a magnetic head using the same.

In order to achieve the above object, a magnetic thin film of the present invention comprises magnetic crystal grains. The magnetic thin film comprises a region where an average crystal size of the magnetic crystal grains along a first direction is smaller than an average crystal size the magnetic crystal grains along a second direction that is orthogonal to the first direction. The magnetization along the first direction is effected by an external magnetic field that is smaller than an external magnetic field for the magnetization along the second direction.

In such a magnetic thin film, in the above-described region, a magnetic interaction between magnetic crystal grains along the first direction is larger than an magnetic interaction between magnetic crystal grains along the second direction. The utilization of the magnetic interaction between magnetic crystal grains provides a magnetic thin film exhibiting excellent magnetic characteristics in a high frequency region. For example, this magnetic thin film can have a saturation magnetic flux density of 1T or more.

Furthermore, in order to achieve the above object, a magnetic head of the present invention comprises the above-described magnetic thin film.

These and other advantages of the present invention will become apparent to those skilled in the art upon reading and understanding the following detailed description with reference to the accompanying figures.

DESCRIPTION OF THE PREFERRED EMBODIMENTS

Figure 1:
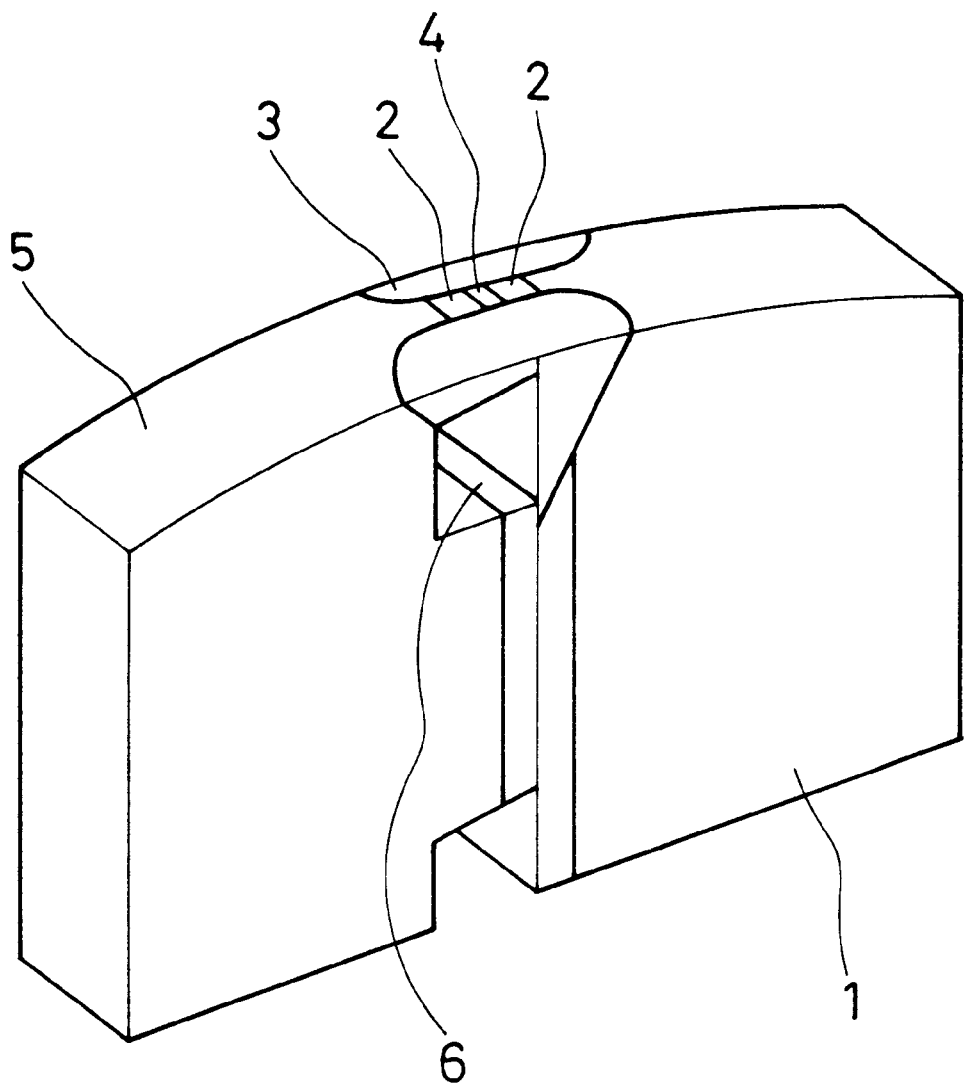
FIG. 1 is a perspective view of an MIG (Metal In Gap) type magnetic head of one embodiment of a magnetic head of the present invention.

As described above, in a preferable embodiment, the magnetic thin film of the present invention includes magnetic crystal grains as a mother phase and comprises a region where an average crystal size of the magnetic crystal grains along the first direction is smaller than an average crystal size of the magnetic crystal grains along the second direction. The average crystal size is an average value of lengths of crystal grains, for example, along each direction in the plane including the first and the second directions.

It is preferable that this region include at least a range in which a magnetic interaction is effected between the magnetic crystal grains. Although this may vary depending on the magnetic crystal grains, generally, this region preferably includes a range with a diameter of 100 nm or more, more preferably 300 nm or more, in a plane including the first direction and the second direction in the thin film. In the magnetic thin film in which the crystal size locally has an anisotropic distribution, a local magnetic anisotropy is generated. This is because the magnitude of an exchange interaction between crystal grains is affected by the number of crystal grains included within a range in a predetermined distance from the crystal grains.

This magnetic anisotropy allows a crystal grain cluster under the influence of the interaction to behave apparently as one independent crystal grain. As a result, the crystal grain cluster also affects magnetic crystal grains in the surrounding regions. Thus, it is believed that the local magnetic anisotropy contributes to the expression of the magnetic anisotropy in the entire magnetic thin film. The magnetic anisotropy expressed in the entire magnetic thin film may be apparently small. However, it is believed that when the magnetic crystal grain cluster starts rotation magnetization at the same time, the local magnetic anisotropy becomes dominant. Therefore, the magnetic thin film having a strong local magnetic anisotropy can provide a high ferromagnetic resonance frequency.

In the above-described magnetic thin film, it is preferable that the relationship between the average crystal sizes of the magnetic crystal grains in the entire thin film meets the above predetermined relationship. According to this preferable embodiment, the anisotropic magnetic field is generated uniformly in the entire magnetic thin film, and the ferromagnetic resonance frequency becomes high. In addition, the number of magnetic domain walls in the magnetic thin film is reduced, so that the magnetic domain wall resonance can be suppressed. Therefore, excellent soft magnetic characteristics can be obtained in a high frequency band.

The above-described relationship between the average crystal sizes can be confirmed by observing the anisotropy in the shape of the magnetic crystal grains in a predetermined plane of the magnetic thin film. For example, in the case of a magnetic thin film having a plane parallel to an interface with the substrate as a plane for rotation magnetization, the directions of the shorter sides in the sections (hereinafter, referred to as "widthwise directions") of the magnetic crystal grains on this plane are preferably oriented in a predetermined direction (a first inplane direction). On the other hand, the direction of the longer sides of the sections (hereinafter, referred to as "longitudinal directions") of the magnetic crystal grains are preferably oriented in a direction orthogonal to the first inplane direction (a second inplane direction). In such a magnetic thin film, the first inplane direction is the axis of easy magnetization, and the second inplane direction is the axis of hard magnetization. This is because, in the second inplane direction, the interaction between the magnetic crystal grains is relatively low, and thus the canceling of the crystal magnetic anisotropy is relatively low. The plane for rotation magnetization depends on the use form of the magnetic thin film, and it is not limited to the inplane directions.

The magnetic crystals included in the magnetic thin film preferably have a crystal size that can cause an exchange interaction with each other. The average crystal size of the magnetic crystal grains is preferably from 2 nm to 200 nm, more preferably 2 nm to 100 nm, in the first direction. When the size is less than 2 nm, sufficient magnetization cannot be expressed. When it exceeds 200 nm, the interaction between the crystal grains is reduced.

In one preferable embodiment of the magnetic thin film of the present invention, in a section including the first direction and the second direction in the region, the average crystal size of the magnetic crystal grains along at least one direction is from 2 nm to 200 nm, more preferably 2 nm to 100 nm. An average direction of normals of at least one group of equivalent (the same kind of) crystal planes of the magnetic crystal grains in the region is oriented in a predetermined direction. The orientation of the crystal orientations of the magnetic crystal grains provides an anisotropy to the interaction between the magnetic crystal grains.

Similarly to the above, it is preferable that this region include at least a range with a diameter of 100 nm or more, more preferably 300 nm or more, in a plane including the first direction and the second direction in the thin film. In the magnetic thin film in which a specific crystal plane in each magnetic crystal grain (for example, (110) plane) is locally oriented, a local magnetic anisotropy is generated. Therefore, as described above, the magnetic thin film in this embodiment can provide a high ferromagnetic resonance frequency. Furthermore, in the magnetic thin film, the average crystal size of the magnetic crystal grains in a specific direction is preferably from 2 nm to 200 nm over the entire thin film, and specific crystal planes are preferably oriented in a predetermined direction.

Furthermore, in the magnetic thin film in which the crystal orientations are oriented in a predetermined direction, the axis of hard magnetization of each magnetic crystal grain caused by the crystal magnetic anisotropy has an orientation. In this magnetic thin film, it is preferable that the direction in which the axes of hard magnetization of the crystal grains are oriented agrees with the axis of hard magnetization of the magnetic thin film. This is preferable because a further stronger magnetic anisotropy can be obtained.

The magnetic thin film of the present invention can be realized, for example by growing approximately needle or columnar magnetic crystal grains on a substrate. The magnetic thin film preferably includes these magnetic crystal grains at least in the region. The longitudinal directions of approximately needle or columnar magnetic crystal grains are preferably oriented in a predetermined direction. Furthermore, the orientation direction preferably tilts with respect to the interface with the substrate (the surface of the substrate).

The degree of this tilt is not particularly limited, but for example, an angle formed by the normal direction of the interface with the substrate and the longitudinal direction is preferably from 5° to 45°.

Furthermore, the degree of the tilt is preferably in the range in which the following relationship is satisfied when observed in a section perpendicular to the interface with the substrate:

$$0 \leq |\alpha e| < |\alpha h| < \pi/2 \text{ [rad] } (90°)$$

where αe represents an angle formed by the longitudinal direction of the magnetic crystal grain in a section parallel to the axis of easy magnetization and perpendicular to the interface with the substrate and the normal direction of the interface, and αh represents an angle formed by the longitudinal direction of the magnetic crystal grain in a section parallel to the axis of hard magnetization and perpendicular to the interface with the substrate and the normal direction of the interface.

Furthermore, the tilt is more preferably in the range in which the following relationship is satisfied.

$$0 \leq |\alpha e| < |\alpha h| \leq \pi/4 \text{ [rad] } (45°)$$

When approximately needle or columnar magnetic crystal grains grow with a tilt toward the interface with the substrate, elongated magnetic crystal grains are observed in a film plane parallel to the interface with the substrate (e.g., the surface of the film). Therefore, the magnetic crystal grain cluster is observed in which, preferably, the widthwise directions are oriented in the first inplane direction, and the longitudinal directions are oriented in the second inplane direction orthogonal to the first inplane direction. When the plane for rotation magnetization is parallel to the interface with the substrate in this form, as described above, the first inplane direction is the axis of easy magnetization, and the second inplane direction is the axis of hard magnetization, resulting from the degree of the canceling of the crystal magnetic anisotropy.

When the magnetization plane is parallel to the interface with the substrate, the average crystal width of the approximately needle or columnar magnetic crystal grains (an average crystal size in the widthwise direction of the crystal grains) in this plane is preferably from 2 nm to 200 nm, more preferably 2 nm to 100 nm.

In the magnetic thin film, the distance from the substrate may change the crystal structure. By utilizing this change, the average crystal size of the approximately needle or columnar magnetic crystal grains can be adjusted. More specifically, when an average crystal size in the widthwise direction of the magnetic crystal grains in a range of 500 nm or less from the interface with the substrate (in the normal direction of the interface) is represented by $d_1$, and an average crystal size in the widthwise direction of the magnetic crystal grains in a range more than 500 nm from the interface with the substrate is represented by $d_2$, the relationship: $d_1 > d_2$ is preferably satisfied.

Furthermore, in the range of 500 nm or less from the interface with the substrate, the average crystal size in the widthwise direction of the magnetic crystal grains is preferably from 2 nm to 200 nm. On the other hand, in the range more than 500 nm from the interface with the substrate, the average crystal size in the widthwise direction of the magnetic crystal grains is preferably from 2 nm to 100 nm.

In the above-described magnetic thin film, a gap between the magnetic crystal grains in a plane parallel to the interface with the substrate is preferably smaller in the widthwise direction than in the longitudinal direction of the magnetic crystal grains in the plane. In order words, it is preferable that, for example, in the surface of the thin film, more inclusions are present between the crystal grains in the longitudinal direction (the second inplane direction) than in the widthwise direction (the first inplane direction) of the magnetic crystal grains, and the magnetic crystal grains are packed more densely in the widthwise direction. The presence of inclusions suppresses the exchange interaction between the magnetic crystal grains.

The above-described magnetic thin film may include branched-shaped bodies (branched magnetic crystal grains) formed by combination of the approximately needle or columnar magnetic crystal grains, instead of the approximately needle or columnar magnetic crystal grains. In this case, similarly to the above, when the magnetic crystal grain constituting the trunk portion of the branched shape and the approximately needle or columnar magnetic crystal grain constituting the branch portion are observed in a plane parallel to the interface with the substrate, it is preferable that an orientation is generated in the interaction between magnetic crystal grains in the plane. Therefore, for example, it is preferable to form branched magnetic crystal grains so that the shape, the number, and the angle of growth of the magnetic crystal grains constituting the branch portion are different between inplane directions.

In the case where the branched-shaped magnetic crystal grains are included, it is preferable that the directions in which the trunk portions (principal axes) of the branched-shaped bodies are oriented tilt with respect to the substrate, as in the case of the longitudinal directions of the approximately needle or columnar magnetic crystal grains.

In the above-described magnetic thin film, it is preferable that a plane parallel to an interface with a substrate on which the film is formed is a plane for rotation magnetization, although this is not particularly limited thereto. Furthermore, it is preferable that the magnetic thin film comprises at least a plane perpendicular to an interface with a substrate on which the film is formed as a plane for rotation magnetization.

According to the above-described magnetic thin film, an anisotropic magnetic field can be generated without performing magnetic annealing, while retaining a high saturation magnetic flux density of 1T or more.

Furthermore, the magnetic thin film may be formed on a substrate as a single layer, or may be used in combination with other thin films as a multi-layered film, if necessary to obtain a desired magnetic characteristic.

For example, the multi-layered magnetic thin film on a substrate preferably includes a magnetic layer formed of the above-described magnetic thin film and an intermediate layer between the magnetic layer and the substrate. The intermediate layer includes at least one selected from the group consisting of an oxide, a carbide, a nitride and a boride. Especially, the magnetic thin film comprising the magnetic layers and the intermediate layers that are formed alternately facilitates the control of the ferromagnetic resonance frequency. This is because the insulation effect of the intermediate layer can suppress overcurrent in the magnetic film. Furthermore, a reduction in the film thickness for one layer can suppress magnetization in planes other than the plane for rotation magnetization. Therefore, it is easy to realize excellent magnetic characteristics in a high frequency band. Furthermore, even if this magnetic thin film is subjected to a miniaturization technique required for various magnetic devices such as a magnetic head and magnetic circuit components, the magnetic anisotropy is hardly dispersed. This is because the shape anisotropy, the internal stress or the like hardly affects the magnetic thin film.

Furthermore, in the magnetic thin film of the present invention, the intermediate layer preferably comprises 5 atom % or more of an element having at least one formation energy selected from the group consisting of an oxide-formation energy and a nitride-formation energy higher than the corresponding formation energy of Mn. This reduces the difference in the etching rate between the magnetic film and the intermediate layer when forming micro patterns, thus facilitating the miniaturization process. More specifically, at least one element selected from the group consisting of Fe, Co, Ni, Cu, Ru, Rh, Pd, Ag, Os, Ir, Pt, Au, Zn and Cr can be used as the above element.

The magnetic thin film of the present invention preferably comprises an underlying layer between the intermediate layer and the magnetic layer. The underlying layer preferably comprises a substance having a lower surface free energy than the surface free energy of at least one selected from the group consisting of Fe and the magnetic layer. According to this preferable embodiment, it is easy to realize a preferable shape or size of the magnetic crystal grains in the magnetic layer regardless of the type of the intermediate layer. The thickness of the underlying layer is preferably 0.1 nm or more. As the underlying layer, an oxide, a nitride, a carbide or a boride of at least one element selected from the group consisting of Al, Ba, Ca, Mg, Si, Ti, V, Zn, Ga and Zr, and/or at least one substance selected from the group consisting of C, Al, Si, Ag, Cu, Cr, Mg, Au, Ca and Zn.

Furthermore, the magnetic thin film of the present invention preferably comprises an underlying layer between the intermediate layer and the magnetic layer. The underlying layer preferably comprises at least one selected from the group consisting of magnetic crystal grains and an amorphous magnetic substance as the mother phase. When such micro crystal grains are used, it is easy to realize a preferable shape or size of the magnetic crystal grains in the magnetic layer regardless of the type of the intermediate layer. The average crystal size of the micro crystal grains is preferably 100 nm or less. Furthermore, similarly to the above, the thickness of the underlying layer is preferably 0.1 nm or more. Furthermore, it is preferable that the underlying layer comprise 5 atom % or more of at least one selected from the group consisting of nitrogen and oxygen, because the interface with the magnetic layer is stabilized.

The magnetic thin film as described above can be suitably used for a magnetic device such as a magnetic sensor and magnetic circuit components, and is especially suitable for a magnetic head such as a MIG (Metal In Gap head), a LAM (Lamination Head) and a head for a hard disk.

Hereinafter, the present invention will be described by way of examples of magnetic heads with reference to the accompanying drawings.

A MIG head shown in FIG. 1 includes a magnetic thin film 2 of the present invention in the vicinity of a magnetic gap 4 of a magnetic core 1 formed of ferrite. The magnetic gap 4 is sandwiched between glass members 3. A hole 6 is formed so that an electromagnetic coil (not shown) can pass through the hole.

Figure 2:
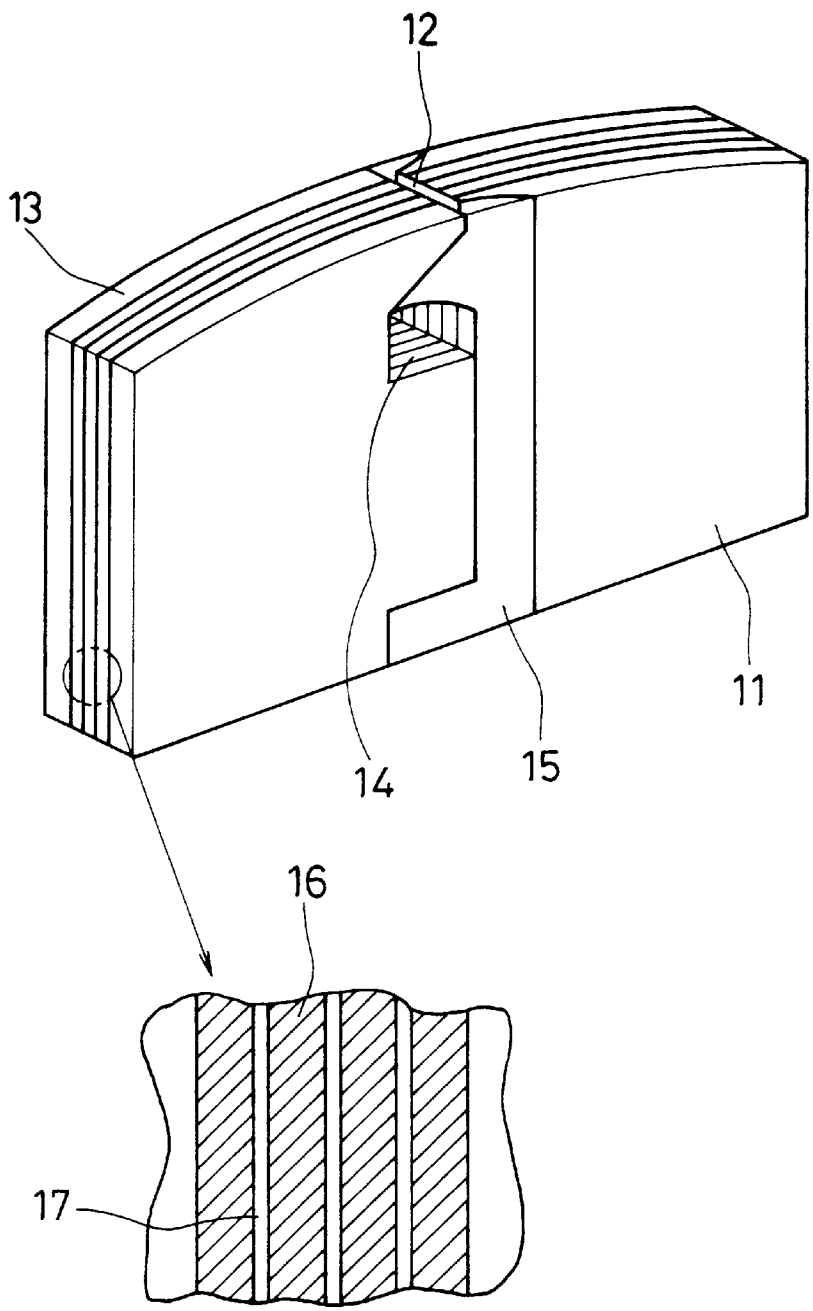
FIG. 2 is a perspective view and a partially enlarged view of a LAM (Lamination) type magnetic head of another embodiment of a magnetic head of the present invention.

A LAM head shown in FIG. 2 includes magnetic thin films 16 of the present invention that are sandwiched between non-magnetic members 11. The magnetic thin films 16 and insulating layers 17 are laminated so as to form a multi-layered member. This multi-layered member is formed so that it is orthogonal to a magnetic gap 12, and arranged so that the section of the multi-layered member faces a tape travel surface 13. This head includes a hole 14 through which an electromagnetic coil can be wound, as the magnetic head of FIG. 1.

Figure 3:
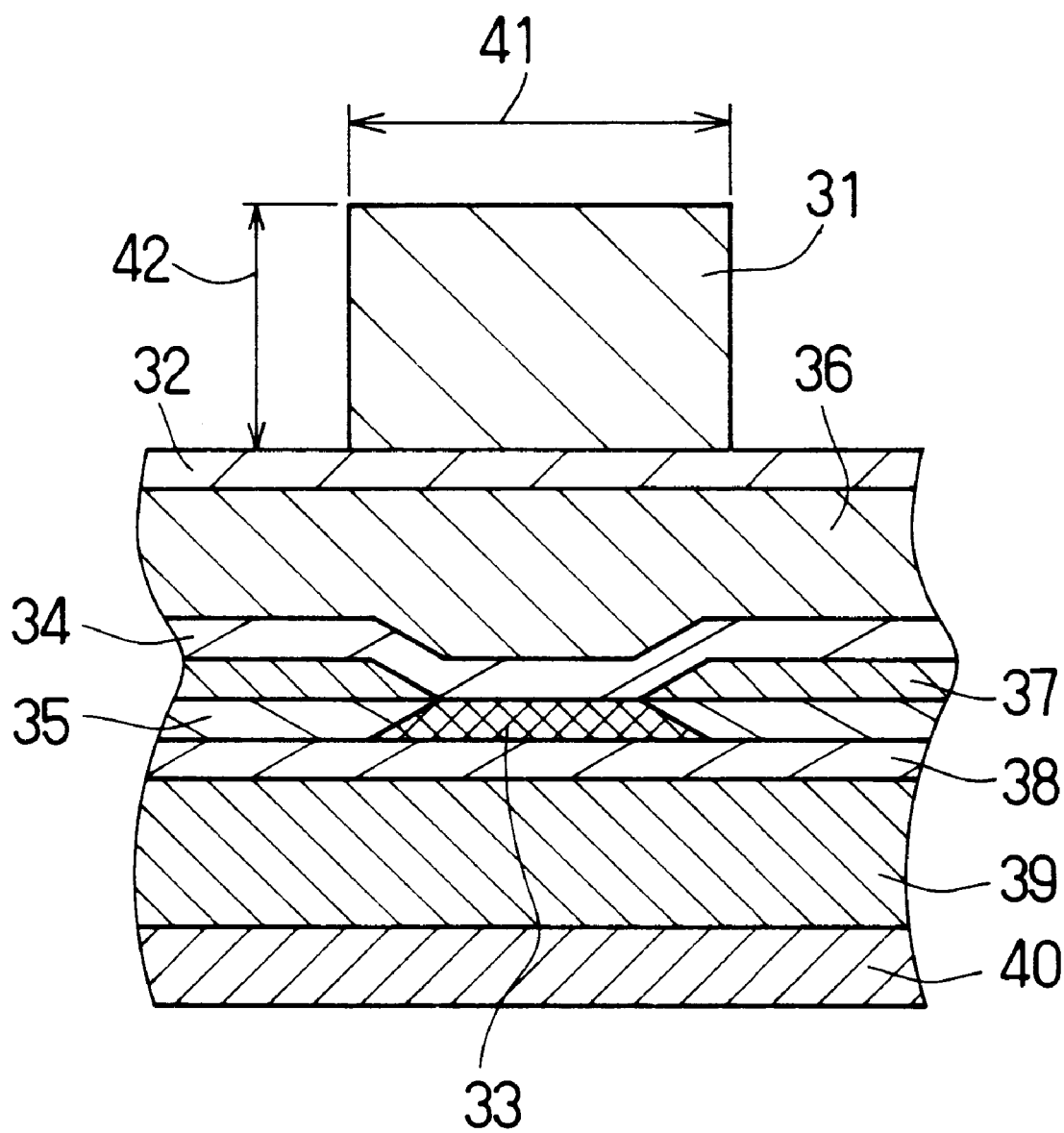
FIG. 3 is a partial cross-sectional view of a magnetic head for a hard disk of still another embodiment of a magnetic head of the present invention.

A head for a hard disk shown in FIG. 3 includes a substrate 40, a reproducing lower shield film 39, a reproducing lower gap film 38, a GMR (giant magnetoresistance) film 33 and a hard magnetic film 35, a reproducing upper gap film 34, a reproducing upper shield film and lower recording magnetic pole 36, and a recording gap film 32 in this order. A terminal 37 is formed between the hard magnetic film 35 and the reproducing upper gap film 34 from both ends toward the GMR portion 33. An upper recording magnetic pole 31 with a predetermined thickness 42 and a width that serves as a recording width 41 is provided on the recording gap film 32.

When the magnetic thin film of the present invention is used for a magnetic head, especially, a LAM head comprising magnetic thin films and insulating films that are laminated, a MIG head comprising ferrite as the core and a recording head for a hard disk in this manner, a magnetic head that hardly makes recording errors in a high frequency band can be obtained. For the LAM head, when the directions of the anisotropy of a magnetic thin film to be formed are dispersed isotropically in planes parallel to the surface of the substrate, excellent characteristics in a high frequency can be obtained. Furthermore, for the MIG head, when anisotropy is provided in the inplane direction parallel to the surface of the ferrite substrate, the recording/reproducing characteristics are improved. Furthermore, for the head for a hard disk, when anisotropy is provided in the inplane direction parallel to the surface of the substrate, the writing ability is improved.

The magnetic thin film of the present invention can be realized by any techniques that have been conventionally used, such as an electrodeposition technique, a super-rapid cooling method and a vapor deposition method. However, when a desired thickness of a film is in the range from several tens of nanometers to several micrometers, it is preferable to produce the film by a vapor deposition method in a low pressure atmosphere. As for the vapor deposition method, sputtering methods such as high frequency magnetron sputtering (RF sputtering method), direct current magnetron sputtering (DC sputtering, opposed-target sputtering, and ion beam sputtering are preferable. Especially, the use of DC magnetron sputtering makes it easy to obtain a material exhibiting excellent soft magnetic characteristics immediately after formation of a film even if the substrate temperature is room temperature or less.

In order to form the magnetic thin film of the present invention by sputtering, first, a composition of the magnetic thin film is determined in view of the saturation magnetic flux density, the soft magnetic characteristics, the value of resistance of a magnetic material, the corrosion resistance or the like. Then, the composition of a sputtering target is determined in view of a discrepancy in the composition. Then, a magnetic thin film is formed by sputtering an alloy target on a substrate in an inert gas. Alternatively, a magnetic thin film is formed by simultaneously sputtering a metal target and additional element pellets that are arranged on the metal target. Alternatively, a magnetic thin film is formed by introducing a part of an additional substance in a gas state into an apparatus and performing reactive sputtering. When the discharge gas pressure, the discharge power, the temperature of the substrate, the bias state of the substrate, the magnetic field value above the target or in the vicinity of the substrate, the shape of the target or the direction in which the particles are incident to the substrate is changed, not only the structure of the magnetic thin film of the present invention, but also the apparent coefficient of thermal expansion, the magnetic characteristics of the film or the like can be controlled.

Furthermore, in view of the maximum of the process temperature for processing the formed magnetic thin film into various devices, it is preferable to control the internal stress immediately after the film is formed so that the internal stress is lowest at that temperature. Furthermore, when it is necessary further to raise the magnetic anisotropy of the magnetic thin film of the present invention, a heat treatment in the magnetic field or formation of a film in the magnetic field can be performed as well.

As a substrate to be used, when the magnetic thin film is processed into an MIG head, a ferrite substrate is used. When the magnetic thin film is processed into a LAM head, a non-magnetic insulating substrate is used. Furthermore, when the magnetic thin film is used as an IC circuit component, a silicone wafer or the like is used as the substrate. An underlying layer or a barrier film may be formed on the substrate, if necessary, in order to prevent the substrate from reacting with the magnetic film, to control the crystal state, to improve the adhesion, or the like.

EXAMPLES

Hereinafter, the present invention will be specifically described by way of examples. However, the present invention is not limited to the examples below. For example, in the examples below, the magnetic thin film is subjected to a heat treatment, but the heat treatment is not indispensable.

In the example below, the structure of the film was analyzed with X-ray diffraction (XRD), a transmission electron microscope (TEM), and a high resolution scanning electron microscope (HR-SEM). "Magnetic crystal grain" described in the examples refers to a continuous crystal region that is believed to have a substantially uniform crystal orientation crystallographically by the comparison of a bright image and a dark image of the TEM. The analysis of the composition was evaluated by EPMA (electron probe microanalysis) and RBS (Rutherford backscattering). In particular, the composition in a micro region was examined by energy dispersion spectroscopy (EDS) annexed to the TEM. The coercive force was evaluated by a BH loop tracer and a superconducting quantum interference device (SQUID). The saturation magnetic flux density was examined by vibration sample magnetometry (VSM). The permeability in a band from several MHz to several GHz was examined by using a one turn coil. Hereinafter, the examples of the present invention will be described in detail.

Example 1

In this example, magnetic thin films were formed by RF magnetron sputtering. The magnetic films were formed under various sputtering conditions such as a discharge gas pressure, a substrate temperature and an angle at which particles are incident to a substrate with various compositions of a target and flow rates of reactant gas. The substrate was located at a position that was substantially not affected by the magnetostatic leakage field from the target. Furthermore, the thickness of the magnetic thin film of each sample was 3 μm. The magnetic characteristics were evaluated after a heat treatment at 480° C. Table 1 shows the results of the evaluation on all the samples of Example 1.

Sample aa to az, ba to bz, and ca to cf were formed under the following conditions,
  Substrate: non-magnetic ceramic disk-shaped substrate with a diameter of 3 mm
  Incident angle to substrate: 0, 15 or 30 degrees
  Substrate temperature: room temperature
  Magnetic film target: alloy target Target size: 3 inch
Discharge gas pressure: 1 to 4 mTorr
Main sputtering gas: Ar
Nitrogen flow ratio: 2 to 4%
Oxygen flow ratio: 0 to 2%
Discharge power: 400 W The incident angle to the substrate is shown by an angle between the normal line of the surface of the substrate and the direction in which the sputtered particles are incident to the substrate.

Samples dg to dj were formed by changing the above conditions to the following conditions.
  Magnetic film target: alloy target consisting of elements described in the table.
  Nitrogen flow ratio: from 2 to 4% to 0%
  Oxygen flow ratio: from 0 to 2% to 0%

Samples dk to dm were formed by changing the above conditions to the following conditions.
  Substrate temperature: from room temperature to 300° C.

TABLE 1

| | | anisotropic magnetic field (Oe) | | |
|---|---|---|---|---|
| Sample | Film Composition (atom %) | Incident angle 0° | Incident angle 15° | Incident angle 30° |
| aa | $(Fe_{98}Ti_1Ta_1)_{93}O_2N_5$ | 0.3 | 7 | 18 |
| ab | $(Fe_{98}Ti_1Hf_1)_{93}O_2N_5$ | 0.2 | 4 | 16 |
| ac | $(Fe_{98}Ti_1Zr_1)_{93}O_2N_5$ | 0.3 | 3 | 10 |
| ad | $(Fe_{98}Ti_1V_1)_{93}O_2N_5$ | 0.1 | 6 | 15 |
| ae | $(Fe_{98}Ti_1Cr_1)_{93}O_2N_5$ | 0.4 | 5 | 13 |
| af | $(Fe_{98}Ti_1Al_1)_{93}O_2N_5$ | 0.2 | 4 | 12 |
| ag | $(Fe_{98}Ga_1Ti_1)_{93}O_2N_5$ | 0.3 | 6 | 12 |
| ah | $(Fe_{98}Ga_1Zr_1)_{93}O_2N_5$ | 0.4 | 5 | 15 |
| ai | $(Fe_{98}Ga_1Hf_1)_{93}O_2N_5$ | 0.2 | 4 | 14 |
| aj | $(Fe_{98}Ga_1Ta_1)_{93}O_2N_5$ | 0.6 | 6 | 13 |
| ak | $(Fe_{98}Ga_1V_1)_{93}O_2N_5$ | 0.3 | 8 | 15 |
| al | $(Fe_{98}Al_1Ti_{0.5}Nb_{0.5})_{93}O_2N_5$ | 0.3 | 7 | 13 |
| am | $(Fe_{98}Al_1Ti_{0.5}Ta_{0.5})_{93}O_2N_5$ | 0.5 | 6 | 17 |
| an | $(Fe_{98}Al_1Ti_{0.5}V_{0.5})_{93}O_2N_5$ | 0.4 | 4 | 16 |
| ao | $(Fe_{98}Al_1V_{0.5}Ta_{0.5})_{93}O_2N_5$ | 0.2 | 6 | 13 |
| ap | $(Fe_{98}Al_1V_{0.5}Hf_{0.5})_{93}O_2N_5$ | 0.3 | 6 | 14 |
| aq | $(Fe_{98}Si_1Ti_{0.5}Nb_{0.5})_{93}O_2N_5$ | 0.5 | 3 | 16 |
| ar | $(Fe_{98}Si_1Ti_{0.5}Ta_{0.5})_{93}O_2N_5$ | 0.7 | 4 | 15 |
| as | $(Fe_{98}Si_1Ti_{0.5}V_{0.5})_{93}O_2N_5$ | 0.6 | 6 | 13 |
| at | $(Fe_{98}Si_1Al_{0.5}Ti_{0.5})_{93}O_2N_5$ | 0.9 | 5 | 12 |
| au | $(Fe_{98}Si_1Al_{0.5}Ta_{0.5})_{93}O_2N_5$ | 0.7 | 6 | 16 |
| av | $(Fe_{98}Si_1Al_{0.5}Hf_{0.5})_{93}O_2N_5$ | 0.5 | 4 | 11 |
| aw | $(Fe_{98}Si_1Al_{0.5}V_{0.5})_{93}O_2N_5$ | 0.6 | 5 | 16 |
| ax | $(Fe_{98}Si_1Al_{0.5}Zr_{0.5})_{93}O_2N_5$ | 1.0 | 7 | 19 |
| ay | $(Fe_{98}Ge_1Al_{0.5}Nb_{0.5})_{93}O_2N_5$ | 0.4 | 5 | 18 |
| az | $(Fe_{98}Ge_1Al_{0.5}Ta_{0.5})_{93}O_2N_5$ | 0.6 | 5 | 15 |
| ba | $(Fe_{98}Ti_1Ta_1)_{92}N_8$ | 0.7 | 3 | 12 |
| bb | $(Fe_{98}Ti_1Hf_1)_{92}N_8$ | 0.6 | 5 | 15 |
| bc | $(Fe_{98}Ti_1Zr_1)_{92}N_8$ | 0.5 | 6 | 13 |
| bd | $(Fe_{98}Ti_1V_1)_{92}N_8$ | 0.3 | 4 | 14 |
| be | $(Fe_{98}Ti_1Cr_1)_{92}N_8$ | 0.2 | 5 | 12 |
| bf | $(Fe_{98}Ti_1Al_1)_{92}N_8$ | 0.3 | 6 | 14 |
| bg | $(Fe_{98}Ga_1Ti_1)_{92}N_8$ | 0.2 | 8 | 15 |
| bh | $(Fe_{98}Ga_1Zr_1)_{92}N_8$ | 0.4 | 8 | 12 |
| bi | $(Fe_{98}Ga_1Hf_1)_{92}N_8$ | 0.6 | 7 | 13 |
| bj | $(Fe_{98}Ga_1Ta_1)_{92}N_8$ | 0.6 | 6 | 17 |
| bk | $(Fe_{98}Ga_1V_1)_{92}N_8$ | 0.7 | 6 | 16 |
| bl | $(Fe_{98}Al_1Ti_{0.5}Nb_{0.5})_{92}N_8$ | 0.9 | 5 | 12 |
| bm | $(Fe_{98}Al_1Ti_{0.5}Ta_{0.5})_{92}N_8$ | 0.5 | 5 | 15 |
| bn | $(Fe_{98}Al_1Ti_{0.5}V_{0.5})_{92}N_8$ | 0.2 | 7 | 13 |
| bo | $(Fe_{98}Al_1V_{0.5}Ta_{0.5})_{96}N_8$ | 0.6 | 8 | 19 |
| bp | $(Fe_{98}Al_1V_{0.5}Hf_{0.5})_{92}N_8$ | 0.7 | 7 | 12 |
| bq | $(Fe_{98}Si_1Ti_{0.5}Nb_{0.5})_{92}N_8$ | 0.5 | 6 | 15 |
| br | $(Fe_{98}Si_1Ti_{0.5}Ta_{0.5})_{92}N_8$ | 0.5 | 5 | 17 |
| bs | $(Fe_{98}Si_1Ti_{0.5}V_{0.5})_{92}N_8$ | 0.7 | 8 | 16 |
| bt | $(Fe_{98}Si_1Al_{0.5}Ti_{0.5})_{92}N_8$ | 0.6 | 8 | 20 |
| bu | $(Fe_{98}Si_1Al_{0.5}Ta_{0.5})_{92}N_8$ | 0.8 | 7 | 15 |
| bv | $(Fe_{98}Si_1Al_{0.5}Hf_{0.5})_{92}N_8$ | 0.3 | 5 | 13 |

TABLE 1-continued

|  |  | anisotropic magnetic field (Oe) | | |
|---|---|---|---|---|
| Sample | Film Composition (atom %) | Incident angle 0° | Incident angle 15° | Incident angle 30° |
| bw | $(Fe_{98}Si_1Al_{0.5}V_{0.5})_{92}N_8$ | 0.7 | 6 | 12 |
| bx | $(Fe_{98}Si_1Al_{0.5}Zr_{0.5})_{92}N_8$ | 0.1 | 5 | 11 |
| by | $(Fe_{98}Ge_1Al_{0.5}Nb_{0.5})_{92}N_8$ | 0.3 | 6 | 16 |
| bz | $(Fe_{98}Ge_1Al_{0.5}Ta_{0.5})_{92}N_8$ | 0.6 | 7 | 17 |
| ca | $(Fe_{76}Si_{19}Al_3Ti_2)_{93}O_1N_6$ | 0.1 | 3 | 8 |
| cb | $(Fe_{76}Si_{19}Al_3Ti_2)_{92}N_8$ | 0.2 | 4 | 9 |
| cc | $(Fe_{76}Si_{19}Al_3V_2)_{92}O_1N_6$ | 0.1 | 3 | 6 |
| cd | $(Fe_{76}Si_{19}Al_3V_2)_{92}N_8$ | 0.1 | 4 | 7 |
| ce | $(Fe_{77}Si_{19}Al_3Ta_1)_{92}N_8$ | 0.1 | 2 | 5 |
| cf | $(Fe_{76}Si_{19}Al_3Nb_2)_{92}N_8$ | 0.1 | 3 | 6 |
| dg | $Fe_{73}Si_{18}Al_9$ | 0.3 | 0.2 | 0.3 |
| dh | NiFe | 1.5 | 1.5 | 1.7 |
| di | CoNbZrTa | 1.7 | 2.2 | 2.3 |
| dj | CoZrTa | 1.3 | 1.8 | 2.2 |
| dk | $(Fe_{98}Ti_1Ta_1)_{93}O_2N_5$ | 0.5 | 0.7 | 1.5 |
| dl | $(Fe_{98}Ti_1Hf_1)_{93}O_2N_5$ | 0.3 | 0.6 | 1.2 |
| dm | $(Fe_{98}Ti_1Zr_1)_{93}O_2N_5$ | 0.3 | 0.9 | 2.1 |

The maximum of the difference in the saturation magnetic field measured in two directions that are orthogonal to each other in the direction parallel to the surface of the substrate (the direction parallel to the surface of the thin film) is shown as the anisotropy of Table 1.

When the film section perpendicular to the surface of the substrate of the obtained magnetic thin film was observed, it was found that the magnetic thin film comprised approximately needle or columnar magnetic crystal grain cluster as its mother phase. Furthermore, the magnetic crystal grain cluster was grown in the direction of the incident angle of the particles to the substrate.

When the surfaces of the thin films of the samples aa to cf formed at an incident angle of 15° or 30° were observed, the magnetic crystal grain cluster was seen as an aggregate of long crystal grains where the longitudinal directions were oriented in a uniform direction. At this time, the longitudinal direction of the magnetic crystal grain corresponded to the axis of hard magnetization, and the widthwise direction corresponded to the axis of easy magnetization.

The magnetic crystal grains further tilted and were grown when the incident angle became larger from 15° to 30°. As a result, the ratio of the long side to the short side of the magnetic crystal grain cluster observed on the surface of the thin film was enlarged. Furthermore, as shown in Table 1, as the incident angle became larger, the anisotropic magnetic field became larger. However, when the incident angle was more than 45°, the ratio of the long side to the short side became small, and the anisotropic magnetic field became smaller. Furthermore, when the incident angle became closer to 90°, the soft magnetic characteristics were degraded. Therefore, the incident angle to the substrate is preferably from 5° to 45°.

Furthermore, the average crystal width (the average crystal size in the widthwise direction) of the magnetic crystal grain was 2 nm to 100 nm on the film plane parallel to the substrate of the samples aa to cf formed at an incident angle of 15° or 30°. This average crystal width changed with the thickness of the thin film. The average crystal width was in the range from 2 nm to 200 nm in regions with a thickness of 500 nm or less from the surface of the substrate, whereas it was in the range from 2 nm to 100 nm in regions with a thickness more than 500 nm from the surface of the substrate.

The average crystal width of the samples dg to dh was about 250 nm to 300 nm, and the average crystal width of the samples dk to dm was about 210 nm to 230 nm. In the samples di and dj an amorphous phase was observed, and the crystal width of the included crystal grains was at most about 2 nm. In these samples, a strong anisotropic magnetic field could not be obtained even if the incident angle was adjusted. Therefore, it was confirmed that a preferable average crystal width was 2 nm to 200 nm in order to generate the anisotropic magnetic field.

When the magnetic thin films of the samples aa to cf formed at an incident angle of 30°, which exhibited a large anisotropic magnetic field, were observed in the section of the film perpendicular to the surface of the substrate and parallel to the growth direction of the magnetic crystal grains, voids which are believed to be generated due to a shadow effect were seen. The voids between the crystal grains were anisotropic. When the magnetic thin film was observed in the section of the film parallel to the substrate, it was found that the gaps between the crystal grains in the longitudinal direction of the magnetic crystal grains were larger than those in the widthwise direction because of the effect of the voids. In order words, the magnetic crystal grains were packed more densely in the widthwise direction. From the results shown in Table 1, it is believed that the anisotropy in the state where the crystal grains are packed also contributes to the expression of the anisotropy.

The saturation magnetic flux density of the magnetic thin film of the samples aa to cf (except for those formed at an incident angle to the substrate of 0°) was 1.3 to 1.9T.

In the above samples, when O and N were substituted partially or completely with B and C, substantially the same correlation between the magnetic characteristics and the crystal structure was obtained.

Furthermore, when the magnetic thin flms were formed by DC magnetron sputtering, substantially the same composition and crystal structure were obtained by changing the discharge gas pressure to 0.5 to 2 mTorr and the power to 100W. The magnetic thin film that was formed in this manner was confirmed to exhibit the anisotropic magnetic field and excellent soft magnetic characteristics immediately after the film was formed. Furthermore, these magnetic thin films also exhibited the soft magnetic characteristics after a heat treatment at 520°. The anisotropic magnetic field also was observed in these magnetic thin film even when the thickness became as thin as about 30 nm.

Example 2

In this example, changes in the magnetic anisotropy involved in a miniaturization process for the magnetic thin films produced in Example 1 were investigated. The shape of the magnetic substance after processing was 3×3×3 μm. In this example, the saturation magnetic fields in the substrate inplane direction and the substrate perpendicular direction were measured, and the anisotropic magnetic field was calculated by subtracting a value in the axis of easy magnetization from a value in the axis of hard magnetization. The saturation magnetic field was measured by using a SQUID. Table 2 shows the results.

The samples al to as of Example 1 (incident angle to the substrate: 0 or 15°) were processed under the following conditions.

Substrate: non-magnetic ceramic substrate
    Processing method: dicing saw
    Film shape: 3×3×3 μm
    Cutting angle: perpendicular to the surface of the substrate
    Measurement direction: X axis (the direction of the axis of hard magnetization in the film plane before processing)

Measurement direction: Y axis (the direction of the axis of easy magnetization in the film plane before processing)

Measurement direction: Z axis (the direction perpendicular to the film plane before processing)

Anisotropic magnetic field:

|Saturation magnetic field on the X axis |–| Saturation magnetic field on the Y axis |, which is represented by X–Y

|Saturation magnetic field on the Z axis |–| Saturation magnetic field on the Y axis |, which is represented by Z–Y Herein, "film plane" refers to a plane parallel to the surface of the substrate.

For comparison, the sample dg of Example 1 (the incident angle to the substrate: 15°) was processed in the same manner as above.

Furthermore, the samples di and dj of Example 1 (the incident angle to the substrate: 15°) were subjected to a heat treatment in the magnetic field immediately after formation of the films and provided with anisotropic magnetic fields of 6 Oe and 7 Oe, respectively, so as to prepare samples ea and eb.

TABLE 2

| | | | Anisotropic magnetic field | |
|---|---|---|---|---|
| | | Incident | | |
| | Film composition (atom %) | angle | X-Y | Z-Y |
| al | $(Fe_{98}Al_1Ti_{0.5}Nb_{0.5})_{93}O_2N_5$ | 15 | 7 | 27 |
| am | $(Fe_{98}Al_1Ti_{0.5}Ta_{0.5})_{93}O_2N_5$ | 15 | 6 | 21 |
| an | $(Fe_{98}Al_1Ti_{0.5}V_{0.5})_{93}O_2N_5$ | 15 | 4 | 36 |
| ao | $(Fe_{98}Al_1V_{0.5}Ta_{0.5})_{93}O_2N_5$ | 15 | 6 | 28 |
| ap | $(Fe_{98}Al_1V_{0.5}Hf_{0.5})_{93}O_2N_5$ | 15 | 6 | 26 |
| aq | $(Fe_{98}Si_1Ti_{0.5}Nb_{0.5})_{93}O_2N_5$ | 15 | 3 | 27 |
| ar | $(Fe_{98}Si_1Ti_{0.5}Ta_{0.5})_{93}O_2N_5$ | 15 | 4 | 20 |
| as | $(Fe_{98}Si_1Ti_{0.5}V_{0.5})_{93}O_2N_5$ | 15 | 6 | 30 |
| al | $(Fe_{98}Al_1Ti_{0.5}Nb_{0.5})_{93}O_2N_5$ | 0 | 0.2 | 40 |
| am | $(Fe_{98}Al_1Ti_{0.5}Ta_{0.5})_{98}O_2N_5$ | 0 | 0.3 | 38 |
| an | $(Fe_{98}Al_1Ti_{0.5}V_{0.5})_{93}O_2N_5$ | 0 | 0.2 | 33 |
| ao | $(Fe_{98}Al_1V_{0.5}Ta_{0.5})_{93}O_2N_5$ | 0 | 0.3 | 41 |
| ap | $(Fe_{98}Al_1V_{0.5}Hf_{0.5})_{93}O_2N_5$ | 0 | 0.2 | 39 |
| aq | $(Fe_{98}Si_1Ti_{0.5}Nb_{0.5})_{93}O_2N_5$ | 0 | 0.1 | 35 |
| ar | $(Fe_{98}Si_1Ti_{0.5}Ta_{0.5})_{93}O_2N_5$ | 0 | 0.3 | 37 |
| as | $(Fe_{98}Si_1Ti_{0.5}V_{0.5})_{93}O_2N_5$ | 0 | 0.0 | 2.5 |
| dg | $Fe_{73}Si_{18}Al_9$ | 15 | 0.2 | 2.5 |
| ea | CoNbZrTa | 15 | 1.8 | 1.9 |
| eb | CoZrTa | 15 | 2.2 | 2.0 |

As shown in Table 2, for the magnetic substances obtained by processing the magnetic thin film in which the magnetic crystal grains were grown obliquely with respect to the surface of the substrate (the samples al to as formed at an incident angle of 15°), when the direction of the axis of easy magnetization was the Y axis, the X axis and the Z axis directions that were orthogonal to the Y axis were the axes of hard magnetization. In these magnetic substances, the magnetic anisotropy on the X axis is relatively small. Therefore, when an external magnetic field is provided in the X axis, the rotation magnetization mainly occurs in the X-Y plane. Therefore, the samples alto as formed at an incident angle of 15° are suitable for a magnetic part of a device for high frequency that requires a high permeability in the film plane.

On the other hand, for the magnetic substances obtained by processing the magnetic thin film in which the magnetic crystal grains were grown perpendicular to the surface of the substrate (the samples al to as formed at an incident angle of 0°), both of the X axis and the Y axis are regarded as the axes of easy magnetization. Therefore, they are suitable for a magnetic part of a device for high frequency that requires a high permeability in the direction perpendicular to the film plane.

In the sample dg, the anisotropy in the Z axis direction was relatively large, but the magnetic crystal width in the axis of easy magnetization was thicker than 100 nm. Therefore, a sufficiently strong anisotropic magnetic field was not expressed. Furthermore, in the amorphous magnetic substances that have been subjected to a heat treatment in a magnetic field such as the samples ea and eb, the anisotropic magnetic field that was 6 or 7 Oe before the miniaturization processing became smaller after the processing. Thus, the anisotropic magnetic field that was provided by a heat treatment in the magnetic field is significantly reduced after the miniaturization processing.

In the samples al to as formed at an incident angle of 0°, which exhibited a strong anisotropic magnetic field, the average crystal orientation along the Z axis direction, which is the direction of the axis of hard magnetization, was on the <110> axis. In the X axis and the Y axis directions, which were the directions of the axis of hard magnetization directions, there was no orientation. Thus, for the expression of the anisotropic magnetic field, it is more preferable that predetermined crystal axes (crystal planes) of the magnetic crystal grains be oriented in a uniform direction. In the samples alto as formed at an incident angle of 15°, unlike the samples al to as formed at an incident angle of 0°, the plane that was oriented in the direction perpendicular to the surface of the substrate was not matched with the (110) plane. The <110> axis is the direction of the axis of hard magnetization of the crystal magnetic anisotropy. Therefore, in order to express a strong anisotropy, it is preferable to match the direction of the axis of hard magnetization of the magnetic substance with the direction of the axis of hard magnetization of the crystal magnetic anisotropy of the magnetic crystal grains constituting the magnetic substance.

Example 3

In this example, magnetic thin films formed by RF magnetron sputtering were examined as to the relationship between the magnetic characteristics and the structure of the film such as the crystal shape that changes depending on the sputtering conditions such as a discharge gas pressure or the like. Table 3 shows the results of the evaluation of all the samples of Example 3. The crystal shape was evaluated by observation with an SEM or a TEM. Furthermore, the thickness of the following samples was 3 μm. The magnetic characteristics were evaluated after a heat treatment at 520° C. under vacuum. The value of the anisotropic magnetic field is shown by the difference obtained by subtracting the saturation magnetic field in the longitudinal direction from the saturation magnetic field in the widthwise direction of the target.

Samples were formed under the following conditions.

Substrate: non-magnetic ceramic substrate processed into a disk with a diameter of 3 mm for measurement of magnetism.

Substrate temperature: water cooling

Magnetic film target: FeAlSiTi alloy target

Target size: 5×15 inch

Discharge gas pressure: 2 to 8 mTorr

Main sputtering gas: Ar

Nitrogen flow ratio: 2%

Oxygen flow ratio: 1%

Discharge power: 2 kW

TABLE 3

| Sample | Gas pressure (mTorr) | Anisotropic magnetic field (Oe) |
|---|---|---|
| ka | 2 | −0.1 |
| ja | 3 | 2.1 |
| jb | 4 | 5.0 |
| jc | 5 | 7.5 |
| jd | 6 | 11 |
| je | 7 | 13 |
| jf | 8 | 17 |
| kc | 10 | 25 |

The samples ja to jc had the structure comprising branched magnetic crystal grains constituted by approximately needle or columnar magnetic crystal grains and crystal grains of approximately columnar or needle portions as the mother phase. As shown in Table 3, as the discharge gas pressure became higher, the anisotropic magnetic field having the axis of hard magnetization in the longitudinal direction of the target and the axis of easy magnetization in the widthwise direction became stronger.

The structures in the sections parallel to the axis of easy magnetization and the axis of hard magnetization of the films of these samples were compared. Then, it was found in all the sections that one of the volume of branches growing from the principal axis (trunk portion) of the branched shape, the number thereof and the angle between the trunk portion and the branch portion became larger, as the gas pressure became larger. This tendency was seen more in the direction of the axis of hard magnetization. Furthermore, the average crystal width (the average crystal size in the widthwise direction) of the approximately needle or columnar magnetic crystal grains was in the range from 2 to 100 nm. The average crystal width tended to become larger, as the gas pressure was higher. In regions within 500 nm from the surface of the substrate, less branched crystal grains were seen, and more columnar crystals grown with a tilt toward the normal direction of the surface of the substrate were seen. The directions of growth of the columnar crystals with respect to the surface of the substrate were not uniform, and the average crystal width thereof was in the range from 2 to 200 nm.

In the samples ka, jd, je, jf and kc, the magnetic crystal grains were constituted only by approximately needle or columnar crystal grains. In the sample kc, the anisotropic magnetic field was large, but the coercive force was high and the soft magnetic characteristics were degraded. In the sample kc, the magnetic crystal grains were constituted by columnar crystal grains and the average crystal width of the grains was above 200 nm. On the other hand, the magnetic crystal grains of the sample ka were constituted by needle crystal grains.

The saturation magnetic flux densities of all the samples were between 1.3 to 1.4T.

When the structures of planes parallel to the surface of the substrate of the samples ja to jf were observed in a dark-field, there were some crystal grain sections in which the crystal orientations were uniform in a region having a length of about 100 nm or more. These sections were confirmed to be crystal grain sections of the trunk portions and the branch portions of the branched magnetic crystal grains. These crystal grain sections were long along the longitudinal direction of the substrate (the longitudinal direction of the target). Thus, the average crystal size had the anisotropic distribution in the plane parallel to the surface of the substrate (the plane for rotation magnetization) in the above samples.

Furthermore, in view of the fact that a diffraction line of a dark-field image in crystal grain sections in the plane parallel to the surface of the substrate is an electron diffraction from a crystal plane substantially perpendicular to this plane, it is preferable for the expression of the anisotropy that in a certain region (e.g., a region including a range of at least 100 nm) in a plane parallel to the plane for rotation magnetization, the crystal orientations have an anisotropic distribution with respect to the inplane direction.

Furthermore, a region where the crystal orientations were relatively uniform was formed in the direction of the axis of hard magnetization due to the branched magnetic crystal grains that had grown with the anisotropy in this direction in the film plane. Thus, it is preferable that the average crystal orientation along the direction of the axis of hard magnetization have a higher orientation than the average crystal orientation along the direction of the axis of easy magnetization.

It was confirmed that the branched magnetic crystal grains were realized by an approach of forming a film while periodically changing the incident angle at which the particles are incident to the substrate, for example, relatively moving the substrate and the target. In this case, it is important to provide anisotropy to the incident angle at which the particles are incident to the substrate in view of the moving direction and the target shape. For example, in the case of a carousel type sputtering apparatus where a target rotates about a substrate, it was confirmed that the incident angle of the particles was required to be less than 90° in order to obtain a sufficient anisotropy.

It also was confirmed that magnetic substances that were produced under the conditions of Example 1 other than the magnetic thin film comprising the above-described elements provided the same results as above. Thus, the characteristics of the magnetic thin film of the present invention mostly result from the effects of, not the composition dependence, but the structure dependence. Furthermore, it was confirmed that providing an orientation so that the principal axes of the branched crystal grains tilted to the surface of the substrate made it possible to increase the anisotropy.

When the magnetic thin films were formed by DC magnetron sputtering, substantially the same composition and crystal structure were obtained. The magnetic thin film that was formed in this manner was confirmed to exhibit the anisotropic magnetic field and excellent soft magnetic characteristics immediately after the film was formed. Furthermore, these magnetic thin films also exhibited the soft magnetic characteristics after a heat treatment at 520°. The anisotropic magnetic field also was observed in these magnetic thin films even when the thickness became as thin as about 30 nm.

Example 4

In this example, magnetic thin films were formed by RF magnetron sputtering under different sputtering conditions such as a discharge gas pressure, a substrate temperature and an incident angle to a substrate, and with different additional elements and flow rates of reactant gas. Then, the film structure such as the composition and the crystal shape, and the resonance frequency were examined. The substrate was located at a position that was substantially not affected by the magnetostatic leakage field from the target. The frequency at which $\mu''$ was highest was taken as the resonance frequency. The calculated value ($f_k$ for the ferromagnetic resonance frequency in Table 4 was calculated in the following equation with the anisotropic magnetic field and the saturation magnetization of a 100 nm single layered film.

$$f_k=(\gamma/2\pi)(4\pi Ms \cdot H_k)^{1/2}$$

Samples fl to fs were formed under the following conditions.
  Structure: multi-layered film of magnetic films formed of the substances described in the table (each layer has a thickness of 100 nm) and $Ai_2O_3$ (each layer has a thickness of 50 nm) (two magnetic layers and two non-magnetic layers including underlying layers: magnetic layer/underlying layer/$Ai_2O_3$ layer/magnetic layer/underlying layer/$Ai_2O_3$ layer/substrate)
  Substrate: non-magnetic ceramic disk-shaped substrate with a diameter of 10 mm
  Incident angle to substrate: 15 degrees
  Substrate temperature: room temperature
  Magnetic film target: alloy target
  Target size: 3 inch
  Discharge gas pressure: 3 mTorr
  Main sputtering gas: Ar
  Nitrogen flow ratio: 2 to 4%
  Discharge power: 400 W Samples gl to gs were formed under the following conditions.
  Structure: multi-layered film of magnetic films formed of the substances described in the table (each layer has a thickness of 100 nm) and $Ai_2O_3$ (each layer has a thickness of 50 nm) (two magnetic layers and two non-magnetic layers including underlying layers: magnetic layer/underlying layer/$Ai_2O_3$ layer/magnetic layer/underlying layer/$Ai_2O_3$ layer/substrate)
  Substrate: non-magnetic ceramic substrate; processed into a disk-shaped substrate with a diameter of 10 mm
  Substrate temperature: water cooling
  Magnetic film target: alloy target
  Target size: 5×15 inch
  Discharge gas pressure: 5 mTorr
  Main sputtering gas: Ar
  Nitrogen flow ratio: 2 to 4%
  Discharge power: 2 kW For comparison, films having the following structure were formed under the same conditions as above (the comparative films are shown by "single layered film" in Table 4).
  Structure: magnetic single layered film (thickness: 100 nm) formed of the substance described in Table 4, underlying layer, $Ai_2O_3$ layer (thickness: 50 nm), (magnetic layer/underlying layer/$Ai_2O_3$ layer/substrate).

The underlying layer was formed of microcrystals of a nitride and an amorphous nitride. These nitrides were constituted by the magnetic substance in Table 4. The thickness of the underlying layer was 1 nm.

TABLE 4

| | | $f_k$ calculated value | frequency of maximum $\mu''$(GHz) single layered film | frequency of maximum $\mu''$(GHz) multi-layered film |
|---|---|---|---|---|
| fl | $(Fe_{98}Al_1Ti_{0.5}Nb_{0.5})_{92}N_8$ | 0.9 | 0.7 | 1.2 |
| fm | $(Fe_{98}Al_1Ti_{0.5}Ta_{0.5})_{92}N_8$ | 0.9 | 0.7 | 1.1 |
| fn | $(Fe_{98}Al_1Ti_{0.5}V_{0.5})_{92}N_8$ | 0.0 | 0.9 | 1.3 |
| fo | $(Fe_{98}Al_1V_{0.5}Ta_{0.5})_{92}N_8$ | 1.1 | 1.0 | 1.3 |
| fp | $(Fe_{98}Al_1V_{0.5}Hf_{0.5})_{92}N_8$ | 1.0 | 1.0 | 1.3 |
| fq | $(Fe_{98}Si_1Ti_{0.5}Nb_{0.5})_{92}N_8$ | 0.9 | 0.8 | 1.2 |
| fr | $(Fe_{98}Si_1Ti_{0.5}Ta_{0.5})_{92}N_8$ | 0.9 | 0.8 | 1.2 |
| fs | $(Fe_{98}Si_1Ti_{0.5}V_{0.5})_{92}N_8$ | 1.1 | 1.2 | 1.3 |
| gl | $(Fe_{98}Al_1Ti_{0.5}Nb_{0.5})_{92}N_8$ | 1.1 | 1.0 | 1.5 |
| gm | $(Fe_{98}Al_1Ti_{0.5}Ta_{0.5})_{92}N_8$ | 1.1 | 1.1 | 1.4 |
| gn | $(Fe_{98}Al_1Ti_{0.5}V_{0.5})_{92}N_8$ | 1.2 | 1.2 | 1.5 |
| go | $(Fe_{98}Al_1V_{0.5}Ta_{0.5})_{92}N_8$ | 1.2 | 1.1 | 1.6 |
| gp | $(Fe_{98}Al_1V_{0.5}Hf_{0.5})_{92}N_8$ | 1.2 | 1.1 | 1.4 |
| gq | $(Fe_{98}Si_1Ti_{0.5}Nb_{0.5})_{92}N_8$ | 1.1 | 1.0 | 1.5 |
| gr | $(Fe_{98}Si_1Ti_{0.5}Ta_{0.5})_{92}N_8$ | 1.0 | 0.9 | 1.2 |
| gs | $(Fe_{98}Si_1Ti_{0.5}V_{0.5})_{92}N_8$ | 1.2 | 1.3 | 1.4 |

For the magnetic thin films of the samples fl to fs, approximately needle or columnar magnetic crystal grains were grown in the direction in which the particles were incident. On the other hand, for the samples gl to gs, approximately needle or columnar magnetic crystal grains and branched magnetic crystal grains in combination thereof were grown in such a manner that the principal axes (trunk portion) of the branched crystal grains tilted toward the surface of the substrate. Especially, crystal grains grown in the substrate located in the position opposing the central portion of the target were grown in such a manner that their trunk portions tilted relatively at random in the longitudinal direction of the target.

In the above samples, the average crystal width was in the range from 2 to 200 nm. According to the results shown in Table 4, the frequency of maximum $\mu''$ of a single layered film substantially matches the calculated value. On the other hand, for the magnetic thin film laminated with intermediate layers, the obtained resonance frequency was higher than the calculated ferromagnetic resonance frequency. Thus, when magnetic layers and intermediate layers are laminated, a higher ferromagnetic resonance frequency than that of a single layered film is provided with the magnetic thin film.

Furthermore, the above-described magnetic thin films were processed into a strip of 50 $\mu$m×2000 $\mu$m×a thickness by lift off technology, and the frequency at which $\mu''$ was highest was examined. As a result, it was found that $\mu''$ of a sample of a single layered film was broadly expanded, compared with a sample with a 10 mm diameter. Thus, the multi-layered structure with intermediate layers can reduce a factor of magnetic anisotropic dispersion such as an uniaxial internal stress during miniaturization processing of the magnetic thin film.

The thicknesses of the intermediate layer and the magnetic layer were changed and the multilayer effect was examined. As a result, it was confirmed that in the case of an operation frequency of several hundreds of MHz to several GHz band, the multilayer was effective when the thickness of the magnetic substance was in the range from 10 nm to 3 $\mu$m and the thickness of the intermediate layer was in the range from 1 nm to 100 nm, although these changed with the resistivity of a material. Especially, in the case of GHz bands, the multilayer was effective when the thickness of the intermediate layer was 10 to 100 nm.

As a material for the intermediate layer, a material having an initial permeability of 10 or less in an operation frequency band is preferable, and a carbide, an oxide, a nitride or a boride having a resistance of $200\mu$ Ω cm or more is more preferable. Especially, a carbide, a boride, an oxide or a nitride of at least one element selected from the group consisting of Al, Ba, Ca, Mg, Si, Ti, V, Zn, Ga and Zr is most preferable. When a microcrystal magnetic substance or an amorphous magnetic substance having an average crystal grain size of 100 nm or less is used as an intermediate layer or an underlying layer (a layer formed immediately under a magnetic layer), a preferable crystal structure to obtain the effect of the present invention can be realized more easily. It was confirmed that when these substances were used as an underlying layer under a single layered magnetic layer, the same effect was obtained.

When a microcrystal magnetic substance or an amorphous magnetic substance having an average crystal grain size of 100 nm or less containing 5 atom % of nitrogen or oxygen is used, the interface with the magnetic layer is stabilized. Although depending on the smoothness of the substrate, when the thickness of the underlying layer is in the range from 0.1 nm to 30 nm, a crystal structure having a preferable average crystal width as described above can be obtained more easily.

Next, magnetic thin films were produced in such a manner that an intermediate layer ($Al_2O_3$) of the sample in Table 4 comprised 1 to 10 atom % of an element having a higher free energy for formation of an oxide or a nitride than that of Mn such as Fe, Co, Ni, Cu, Ru, Rh, Pd, Ag, Os, Ir, Pt, Au, Zn, and Cr. When each sample was processed by using RIE (reactive ion etching) into a shape of 1 $\mu$m×1 $\mu$m×a thickness, slight steps were formed due to the difference in the etching rate between the magnetic film and the intermediate layer in the sample having an intermediate layer of $Al_2O_3$ alone. On the other hand, in the intermediate layer additionally comprising the above-described element, especially, in the samples comprising 5 atom % or more of an element added, the steps were sufficiently small. Thus, it was confirmed that the addition of an element having a higher free energy for formation of an oxide or a nitride than that of Mn facilitates the shape control during the miniaturization processing.

Example 5

The same MIG head as shown in FIG. 1 was produced. The results are shown in Table 5.

Head specification
    Track width: 17 $\mu$m
    Gap depth: 12.5 $\mu$m
    Gap length: 0.2 $\mu$m
    The number of turns N: 16
    Barrier film on ferrite: alumina 3 nm
    Thickness of magnetic film: 4.5 $\mu$m C/N characteristics
    Relative rate=10.2 m/s
    Recording/reproducing frequency=20.9 MHz
    Tape: MP tape Conditions for producing magnetic portion Example A
    Substrate: ferrite substrate
    Incident angle to substrate: 0 degree or 15 degree
    Substrate temperature: room temperature
    Magnetic film target: complex target
    Target size: 3 inch
    Discharge gas pressure: 3 mTorr
    Main sputtering gas: Ar
    Nitrogen flow ratio: 2 to 4%
    Discharge power: 400 W Example B
    Substrate: ferrite substrate
    Substrate temperature: water cooling
    Magnetic film target: alloy target
    Target size: 5×15 inch
    Discharge gas pressure: 5 mTorr
    Main sputtering gas: Ar
    Nitrogen flow ratio: 2 to 4%
    Discharge power: 2 kW

TABLE 5

| Core magnetic thin film | Recording/reproducing output (dB) | | |
|---|---|---|---|
| | Example A | | |
| | 0° | 15° | Example B |
| $(Fe_{76}Si_{19}Al_3Ti_2)_{93}O_1N_6$ | +58.5 | +59.0 | +59.2 |
| $(Fe_{76}Si_{19}Al_3Ti_2)_{92}N_8$ | +57.6 | +58.7 | +58.9 |
| $(Fe_{76}Si_{19}Al_3V_2)_{93}O_1N_6$ | +57.8 | +58.5 | +58.7 |
| $(Fe_{76}Si_{19}Al_3V_2)_{92}N_8$ | +58.0 | +59.1 | +59.0 |
| $(Fe_{77}Si_{19}Al_3Ta_1)_{92}N_8$ | +58.2 | +59.0 | +59.5 |
| $(Fe_{76}Si_{19}Al_3Nb_2)_{92}N_8$ | +57.7 | +58.5 | +59.0 |

In Example A, the magnetic anisotropy was provided in the film plane by producing the film at an incident angle of 15° to the ferrite portion shown in FIG. 1. The head output in this case was not substantially affected by the direction of the axis of hard magnetization and produced excellent values, if the axis of hard magnetization was formed in the film plane. However, in the case of an incident angle to the substrate of 0° in Example A, the head output was lower. In Example B, the magnetic film was firmed so that approximately needle or columnar, or branched magnetic substances had the magnetic anisotropy in the film plane. In this case, as in the case of an incident angle of 15° in Example A, the output was improved. Furthermore, it was confirmed that when a magnetic thin film having a composition other than the above-described compositions but having the above-described crystal structure was used, the head output was improved.

Next, the same LAM type head as shown in FIG. 2 was produced. The magnetic substances used were those of the samples aa to cf (incident angle of 15°) used in Example 1. The magnetic substance having a thickness of 500 nm and $Al_2O_3$ having a thickness of 5 nm were laminated alternately so as to produce a magnetic thin film 3 $\mu$m thick (16 in FIG. 2). Furthermore, this magnetic thin film and $Al_2O_3$ (17 in FIG. 2) having a thickness of 150 nm were laminated alternately so as to produce a multi-layered magnetic member (A type) having an entire thickness of about 19 $\mu$m.

Furthermore, a magnetic thin film was formed so that the inplane anisotropy in the magnetic path was in the same direction. The magnetic thin film 3 $\mu$m thick having uniform orientations of the inplane anisotropy and $Al_2O_3$ having a thickness of 150 nm were laminated so that the directions of the axes of hard magnetization were dislocated by 60° each other. Thus, a multi-layered magnetic member (B type) having a thickness of 19 $\mu$m was produced. When the frequency dependence (10 MHz to 40 MHz) of the recording/reproducing characteristics of the LAM head produced with each of the multi-layered members was examined, the head with the B type magnetic member provided a 2 to 3 dB higher value. For a head including a magnetic substance comprising branched magnetic crystal grains exhibiting the magnetic anisotropy in the plane laminated with $Al_2O_3$ as the magnetic thin film 16, when the film was produced so that the magnetic anisotropy became isotropic in the plane, excellent characteristics were obtained.

Next, the same head for a hard disk as shown in FIG. 3 was produced. A magnetic thin film having a thickness of 200 nm to 1000 nm of the present invention having provided the preferable characteristics in Examples 1 and 3 and $Al_2O_3$ or $SiO_2$ having a thickness of 5 to 50 nm were laminated alternately so as to form a multi-layered magnetic member having an entire thickness of 4 µm (corresponding to 42 in FIG. 3). This multi-layered magnetic member was used as a magnetic pole 31. A recording width 41 was 500 nm. Each magnetic layer was formed so that the axis of hard magnetization was in the direction perpendicular to the plane in FIG. 3. Any head that was obtained in this manner realized a high recording density.

When the magnetic thin film having the magnetic anisotropy of the present invention was used for a reproducing upper shield film and lower recording magnetic pole 36, or reproducing lower shield film 39 for a head for a hard disk, a magnetic head making further fewer bit errors was realized. When $Al_2O_3$ or $SiO_2$ comprised an element having a higher free energy for formation of an oxide or a nitride than Mn, shape-processing of the head was further facilitated.

As described above, according to the present invention, a higher uniaxial anisotropy can be provided to a soft magnetic substance having a high saturation magnetic flux density without using a conventional heat treatment in the magnetic field or a conventional film-forming method in the magnetic field. As a result, it is possible to raise a ferromagnetic resonance frequency by reducing the number of magnetic domain walls in the magnetic thin flim. Thus, excellent characteristics in a high frequency band from several MHz to several GHz that are required by a high frequency magnetic device can be obtained. Furthermore, when the magnetic thin film having the structure of the present invention is used for a metal core of a magnetic head, the error rate of magnetic recording in a high frequency band can be improved significantly.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A magnetic thin film including magnetic crystal grains, the magnetic thin film comprising:
    a region where an average crystal size of the magnetic crystal grains along a first direction is smaller than an average crystal size of the magnetic crystal grains along a second direction that is orthogonal to the first direction,
    wherein magnetization along the first direction is effected by an external magnetic field that is smaller than an external magnetic field for magnetization along the second direction.

2. The magnetic thin film according to claim 1, wherein the average crystal size of the magnetic crystal grains along the first direction is from 2 nm to 200 nm.

3. The magnetic thin film according to claim 1, wherein in a section including the first direction and the second direction in the region, the average crystal size of the magnetic crystal grains along at least one direction is from 2nm to 200 nm, and
    an average direction of normals of at least one group of equivalent crystal planes of the magnetic crystal grains in the region is oriented in a predetermined direction.

4. The magnetic thin film according to claim 3, wherein an axis of hard magnetization caused by crystal magnetic anisotropy of the magnetic crystal grains is oriented along an axis of hard magnetization of the magnetic thin film.

5. The magnetic thin film according to claim 1, wherein the region includes a range with a diameter of 100 nm or more in a plane including the first direction and the second direction.

6. The magnetic thin film according to claim 1, wherein the magnetic thin film includes approximately needle or columnar magnetic crystal grains at least in the region.

7. The magnetic thin film according to claim 6, wherein longitudinal directions of the magnetic crystal grains are oriented in a predetermined direction.

8. The magnetic thin film according to claim 7, wherein a direction in which the longitudinal directions of the magnetic crystal grains are oriented tilts with respect to an interface with a substrate on which the film is formed.

9. The magnetic thin film according to claim 8, wherein the direction in which the longitudinal directions of the magnetic crystal grains are oriented and a normal direction of the interface with the substrate forms an angle of 5° to 45°.

10. The magnetic thin film according to claim 8, wherein the following relationship is satisfied: $0 \leq |\alpha e| < |\alpha h| < \pi/2$ [rad]
    where $\alpha e$ represents an angle formed by the longitudinal direction of the magnetic crystal grain in a section parallel to an axis of easy magnetization and perpendicular to the interface with the substrate and the normal direction of the interface, and $\alpha h$ represents an angle formed by the longitudinal direction in a section parallel to an axis of hard magnetization and perpendicular to the interface and the normal direction.

11. The magnetic thin film according to claim 7, wherein a gap between the magnetic crystal grains in a plane parallel to the interface with the substrate is larger in the longitudinal direction than in the widthwise direction.

12. The magnetic thin film according to claim 1, comprising branched shaped-bodies formed of at least two approximately needle or columnar magnetic crystal grains.

13. The magnetic thin film according to claim 1, satisfiing the following relationship: $d_1 > d_2$,
    where $d_1$ is an average crystal size in the widthwise direction of the magnetic crystal grains in a range with 500 nm or less from an interface with a substrate on which the film is formed, and $d_2$ is an average crystal size in the widthwise direction of the magnetic crystal grains in a range beyond 500 nm from the interface with the substrate.

14. The magnetic thin film according to claim 1, wherein the average crystal size in the widthwise direction of the magnetic crystal grains in a range with 500 nm or less from an interface with a substrate on which the film is formed is from 2 nm to 200 nm, and
    the average crystal size in the widthwise direction of the magnetic crystal grains in a range beyond 500 nm from the interface with the substrate is from 2 nm to 100 nm.

15. The magnetic thin film according to claim 1, wherein a plane parallel to an interface with a substrate on which the film is formed is a plane for rotation magnetization.

16. The magnetic thin film according to claim 1, wherein the magnetic thin film comprises at least a plane perpendicular to an interface with a substrate on which the film is formed as a plane for rotation magnetization.

17. A multi-layered magnetic thin film formed on a substrate, the multi-layered magnetic thin film comprising:

a magnetic layer formed of the magnetic thin film according to claim 1; and an intermediate layer between the magnetic layer and the substrate, wherein the intermediate layer includes at least one selected from the group consisting of an oxide, a nitride, a carbide and a boride.

18. The multi-layered magnetic thin film according to claim 17, wherein the intermediate layer comprises 5 atom % or more of an element having at least one formation energy selected from the group consisting of an oxide-formation energy and a nitride-formation energy higher than the corresponding formation energy of Mn.

19. The multi-layered magnetic thin film according to claim 17, further comprising an underlying layer between the intermediate layer and the magnetic layer, wherein the underlying layer has a surface free energy equal to or lower than the surface free energy of at least one selected from the group consisting of Fe and the magnetic layer.

20. The multi-layered magnetic thin film according to claim 17, further comprising an underlying layer between the intermediate layer and the magnetic layer, wherein the underlying layer comprises at least one selected from the group consisting of magnetic crystal grains and amorphous magnetic substances as a mother phase.

21. A magnetic head comprising a magnetic thin film including magnetic crystal grains, the magnetic thin film comprising a region where an average crystal size of the magnetic crystal grains along a first direction is smaller than an average crystal size of the magnetic crystal grains along a second direction that is orthogonal to the first direction, wherein magnetization along the first direction is effected by an external magnetic field that is smaller than magnetization along the second direction.

* * * * *